(12) United States Patent
Tateyama et al.

(10) Patent No.: US 6,706,322 B2
(45) Date of Patent: Mar. 16, 2004

(54) FILM FORMING APPARATUS AND FILM FORMING METHOD

(75) Inventors: Kiyohisa Tateyama, Kumamoto-ken (JP); Tsutae Omori, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 193 days.

(21) Appl. No.: 10/062,506

(22) Filed: Feb. 5, 2002

(65) Prior Publication Data

US 2002/0071910 A1 Jun. 13, 2002

Related U.S. Application Data

(62) Division of application No. 09/366,959, filed on Aug. 4, 1999, now Pat. No. 6,361,600.

(30) Foreign Application Priority Data

Aug. 4, 1998 (JP) .......................................... 10-232317

(51) Int. Cl.[7] .................................................. B05D 3/12
(52) U.S. Cl. ...................... 427/240; 427/425; 118/52; 118/320; 438/758; 438/780; 438/782
(58) Field of Search ................................ 427/240, 425; 118/52, 320; 438/758, 780, 782

(56) References Cited

U.S. PATENT DOCUMENTS 3,922,936 A  12/1975  Noguchi et al. ............... 82/28
4,227,347 A * 10/1980  Tam ............................... 451/6
4,670,304 A *  6/1987  Miura et al. ................ 427/227
5,095,848 A   3/1992  Ikeno ........................... 118/53
5,673,467 A  10/1997  Miyano et al. ............. 29/29 C
5,718,763 A   2/1998  Tateyama et al. ............ 118/52
5,906,860 A   5/1999  Motoda et al. ............. 427/420

FOREIGN PATENT DOCUMENTS

JP  9-271708  10/1997
JP  9-276775  10/1997

* cited by examiner

Primary Examiner—Shrive P. Beck
Assistant Examiner—Kirsten Crockford Jolley
(74) Attorney, Agent, or Firm—Rader, Fishman & Grauer PLLC

(57) ABSTRACT

A drive pulley is disposed to a driving motor. A plurality of follower pulleys are disposed to a rotating shaft of a spin chuck that vacuum sucks a substrate. A belt is passed from one follower pulley to the drive pulley. Belts are passed from the other follower pulleys to the drive shafts of a plurality of air motors. Since the air motors assist the driving of the driving motor, a large substrate can be rotated at a predetermined rotating acceleration. Thus, a film forming apparatus and a film forming method that allow the quantity of process solution supplied to be reduced and a film of process solution to be equally formed on a substrate can be provided.

5 Claims, 13 Drawing Sheets

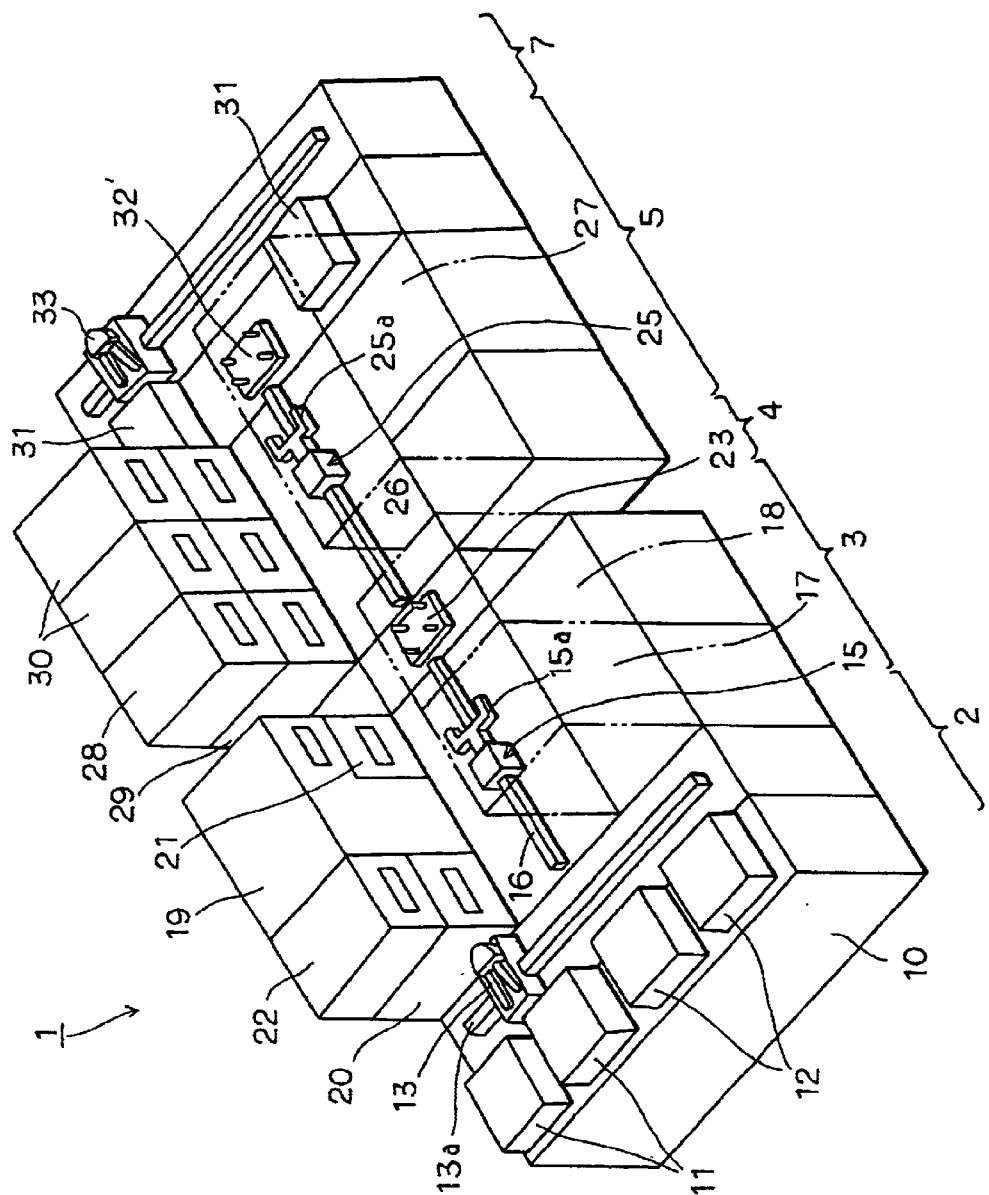
FIG. 1
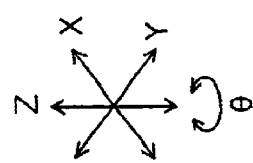

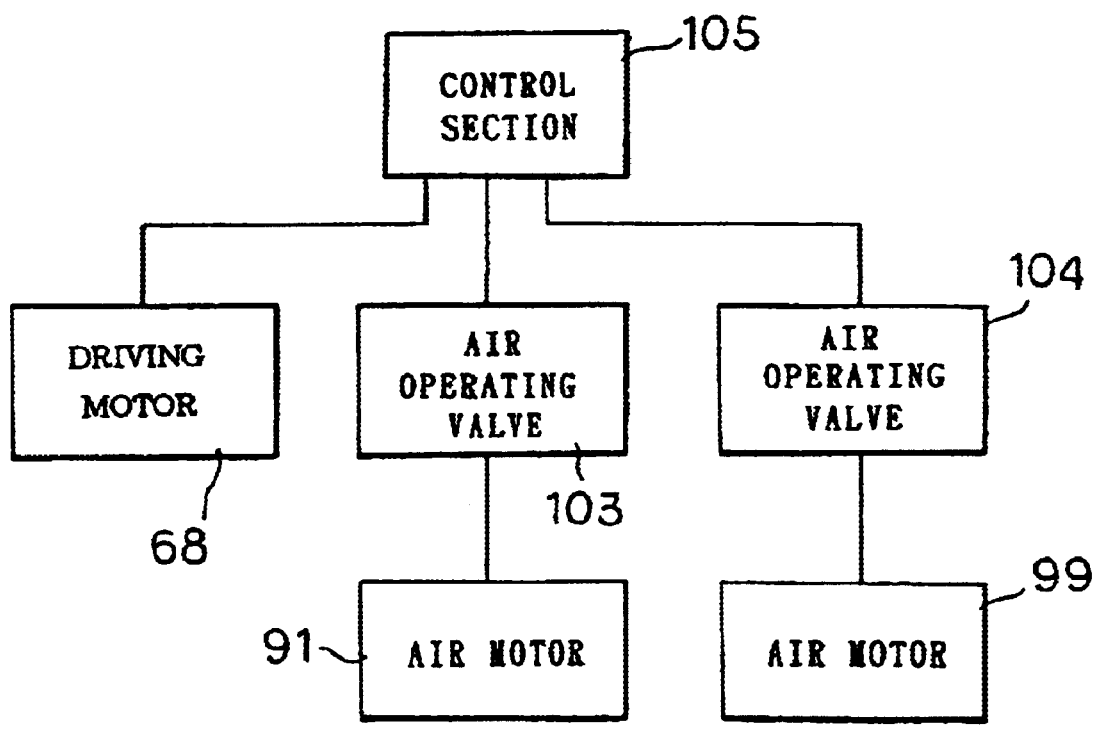
F I G. 4 B

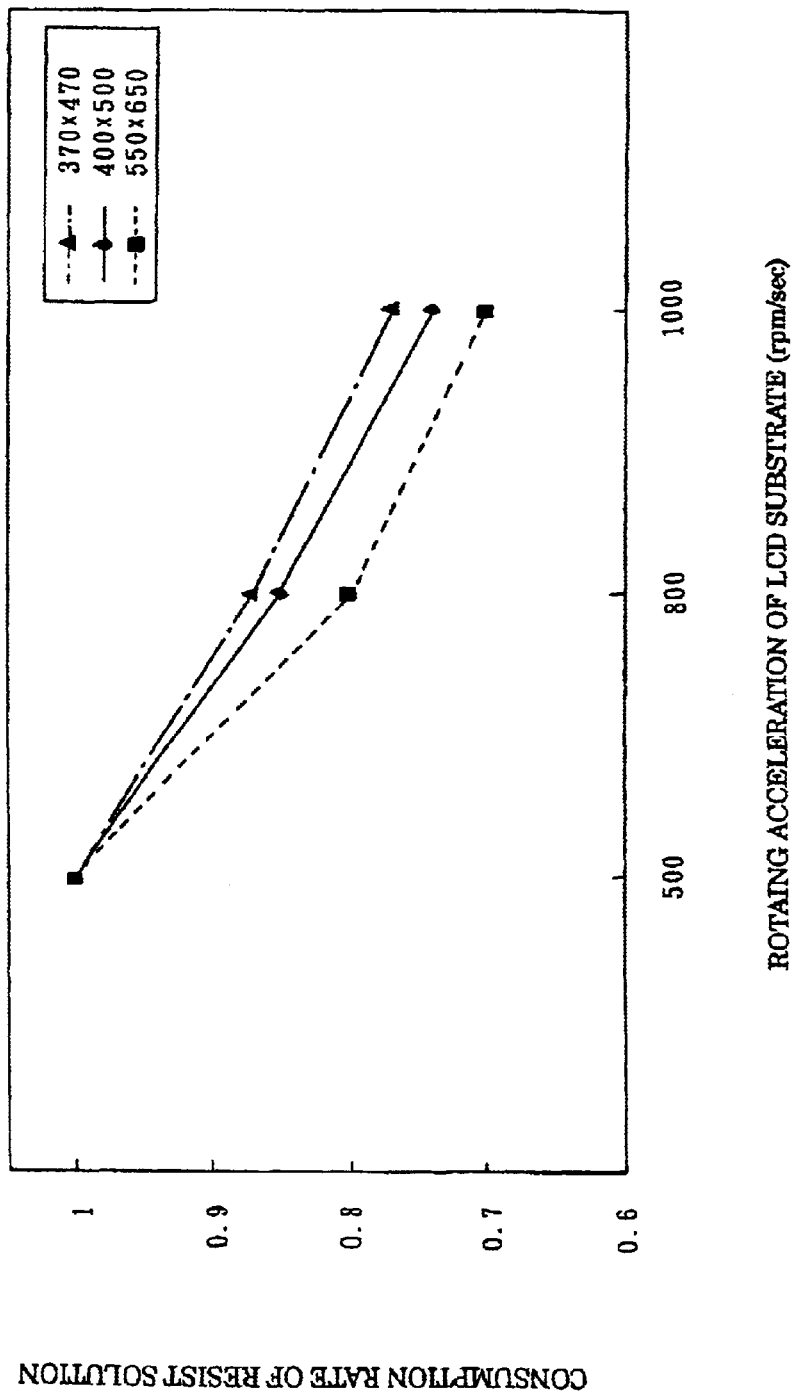
F I G. 8

FILM FORMING APPARATUS AND FILM FORMING METHOD

This application is a divisional of U.S. application Ser. No. 09/366,959 filed Aug. 4, 1999, now U.S. Pat. No. 6,361,600.

BACKGROUND OF THE INVENTION

1. Field of the Invention

The present invention relates to a film forming supplying process solution to a substrate that is rotated so as to spread out the process solution on the substrate and form a film of the process solution on the substrate.

2. Description of the Related Art

In the art of semiconductor fabrication, when a semiconductor layer, an insulation layer, and an electrode layer on an LCD (Liquid Crystal Display) substrate are selectively patterned and etched, as with the case of a semiconductor wafer, a resist film is formed on the front surface of the LCD substrate. To form such a resist film, a spin coater has been used.

The spin coater has a spin chuck, a rotation cup, and a driving motor. The spin chuck rotates an LCD substrate thereon. The rotation cup surrounds all the periphery of the spin chuck. The driving motor rotates the spin chuck and the rotation cup. When a resist film is formed on an LCD substrate by the spin coater, resist solution is dropped at the center portion of the LCD substrate that is rotated. Thus, the resist solution is concentrically spread out by centrifugal force.

Although the resist solution dropped on the LCD substrate starts concentrically spreading out, the resist solution may not equally reach the periphery of the LCD substrate. In this case, the resist solution may break on the LCD substrate. Thus, the resist film may not be equally formed on the LCD substrate. To solve this problem, the resist solution is excessively dropped to the LCD substrate. Thus, the resist solution is fully formed on the entire front surface of the LCD substrate. In this method, however, it is impossible to reduce the quantity of the resist solution. In addition, when the rotating acceleration of the LCD substrate is low, the resist solution that concentrically spreads out breaks on the LCD substrate. Thus, the resist solution cannot be fully formed on the front surface of the LCD substrate.

To solve such a problem, conventionally, a high torque motor was sometimes used. In other words, by rotating the LCD substrate with a high torque motor, centrifugal force applied to the resist solution is strengthened. Thus, the resist solution equally and concentrically spreads out from the center of the LCD substrate to the periphery thereof. Consequently, the quantity of the resist solution can be reduced. In addition, the resist film with an equal thickness can be formed on the front surface of the LCD substrate.

However, since the sizes of LCD substrates are becoming large, they are becoming heavy. Thus, it is difficult to rotate an LCD substrate at a large rotating acceleration. In addition, a high torque motor that can rotates an LCD substrate at a large rotating acceleration is currently not available. Even if such a motor becomes available, the apparatus becomes large and expensive. In addition, the footprint becomes large. Moreover, until the LCD substrate rotates at a predetermined rotating speed, it takes a long time. Thus, the resist solution may not equally spread out from the center of the LCD substrate to the periphery thereof. Consequently, unless the resist solution is excessively dropped, the resist film with the equal thickness cannot be formed.

SUMMARY OF THE INVENTION

The present invention is made from the above-described point of view. An object of the present invention is to provide a film forming apparatus and a film forming method that allow the quantity of process solution supplied to a substrate to be decreased and a film of the process solution to be formed on a process surface of the substrate at low cost.

An aspect of the present invention is a film forming apparatus for supplying process solution to a substrate, spreading out the process solution on the substrate, and forming a film of the process solution on the substrate, comprising a driving means for rotating the substrate, wherein said driving means has a main driving mechanism, an auxiliary driving mechanism for assisting the driving of said main driving mechanism, and a controlling means for causing the operation time of said assisting driving mechanism to overlap with the operation time of said main driving mechanism.

According to the present invention, the operation time of the main driving mechanism and the operation time of the auxiliary driving mechanism that assists the driving of the main driving mechanism can be temporarily overlapped. Thus, even if the size of a substrate becomes large, it can be rotated at a large rotating acceleration. Consequently, the process solution supplied to the substrate can be equally and concentrically spread out to the periphery of the substrate. As a result, the film of the process solution can be formed on the substrate with an equal thickness.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 1 is a perspective view showing the exterior of a coating/developing apparatus having a coating/periphery removing unit according to an embodiment of the present invention;

FIG. 4B is a block diagram for explaining the structure of a controlling portion of an auxiliary driving mechanism;

FIG. 8 is a graph showing the relation between rotating accelerations of three LCD substrates in different sizes shown in FIG. 7 and the consumption rates of resist solution therewith;

DESCRIPTION OF PREFERRED EMBODIMENT

Figure 2:
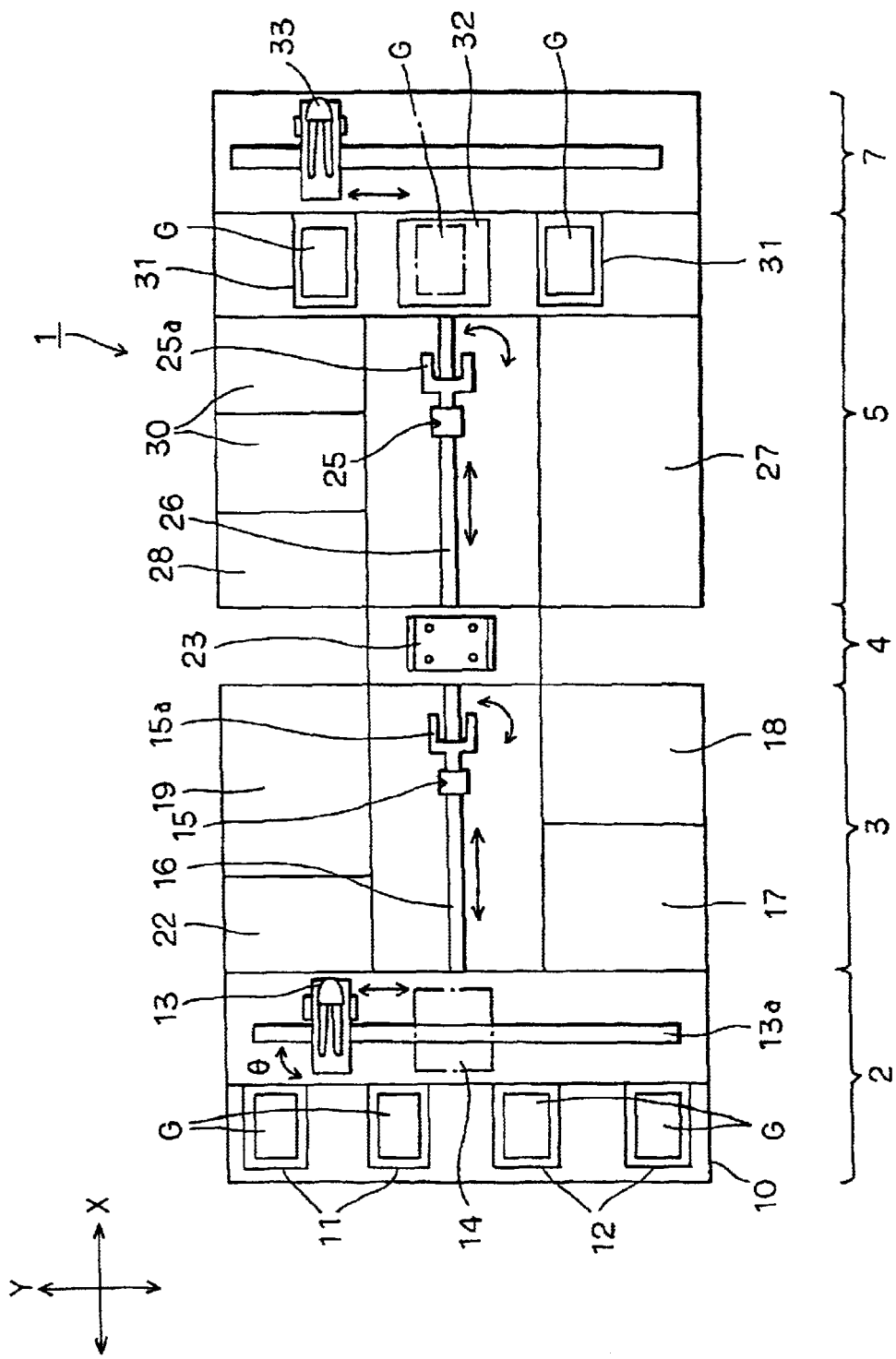
FIG. 2 is a plan view showing the coating/developing apparatus shown in FIG. 1.

FIG. 1 is a perspective view showing the structure of a coating/developing apparatus. FIG. 2 is a plan view of FIG. 1.

As shown in FIGS. 1 and 2, the coating/developing apparatus 1 is composed of a loader portion 2, a first process portion 3, a second process portion 5, and an interface portion 7. The loader portion 2 loads and unloads for example a rectangular LCD substrate G. The first process portion 3 processes an LCD substrate G. The second process portion 5 is connected to the first process portion 3 through an interface portion 4. The interface portion 7 transfers an LCD substrate G between the second process portion 5 and for example an exposing unit (not shown).

The loader portion 2 has a cassette table 10. The cassette table 10 holds a plurality of cassettes 11 and a plurality of cassettes 12. Each of the cassettes 11 accommodates a plurality of raw LCD substrates. Each of the cassettes 12 accommodates a plurality of processed LCD substrates. The cassettes 11 and 12 are placed on the cassette table 10 in such a manner that access openings of the cassettes 11 and 12 face the first process portion 3. In addition, the loader portion 2 has a sub-conveying unit 13 that conveys an LCD substrate G.

The sub-conveying unit 13 can travel in the direction along a conveying rail 13a (Y direction) and the accommodating direction of LCD substrates G (Z direction) in the cassettes 11 and 12. In addition, the sub-conveying unit 13 can rotate in the θ direction. The sub-conveying unit 13 can access a transferring table 14 and place an LCD substrate G thereon.

Various process units that perform predetermined processes for LCD substrates G are disposed on both sides of a conveying rail 16. On one side of the conveying rail 16, a scrubber cleaning unit 17 and a developing unit 18 are adjacently disposed. The scrubber cleaning unit 17 cleans an LCD substrate G unloaded from each of the cassettes 11. The developing unit 18 performs a developing process for an LCD substrate G. On the other side of the conveying rail 16, an ultraviolet ray ozone cleaning unit 19, two cooling units 20 and 21, and two heating units 22 are disposed. Part of the ultraviolet ray ozone cleaning unit 19 is disposed above the cooling unit 21. The heating unit 22 is disposed above the cooling unit 20. The main conveying unit 15 has a conveying arm 15a. The conveying arm 15a loads and unloads an LCD substrate G to/from these process units. The interface portion 4 disposed between the first process portion 3 and the second process portion 5 has a transferring table 23 on which an LCD substrate G can be placed.

The second process portion 5 has a main conveying unit 25 and a conveying rail 26. On one side of the conveying rail 26, a coating/periphery removing unit 27 according to the embodiment of the present invention is disposed. On the other side of the conveying rail 26, a hydrophobic process unit 28, a cooling unit 29, and two heating units 30 are adjacently disposed. The hydrophobic process unit 38 performs a hydrophobic process for an LCD substrate G. The cooling unit 29 cools an LCD substrate G. Each of the heating units 30 heats an LCD substrate G. In FIG. 1, two heating units 30 are disposed above two heating units 30. The main conveying unit 25 also has an conveying arm 25a. The conveying arm 25a loads and unloads an LCD substrate G to/from each process unit of the second process portion 5.

The interface portion 7 has a transferring table 32 and a sub-conveying unit 33. The transferring table 32 temporarily holds a cassette 31 that accommodates an LCD substrate G as to adjust a tact between the coating/developing apparatus 1 and the exposing unit (not shown). The sub-conveying unit 33 conveys an LCD substrate G to each of the cassettes 31, the conveying table 32, and the exposing unit (not shown).

The coating/developing apparatus 1 is structured as described above. Next, the coating/periphery removing unit 27 disposed in the coating/developing apparatus 1 will be described.

Figure 3:
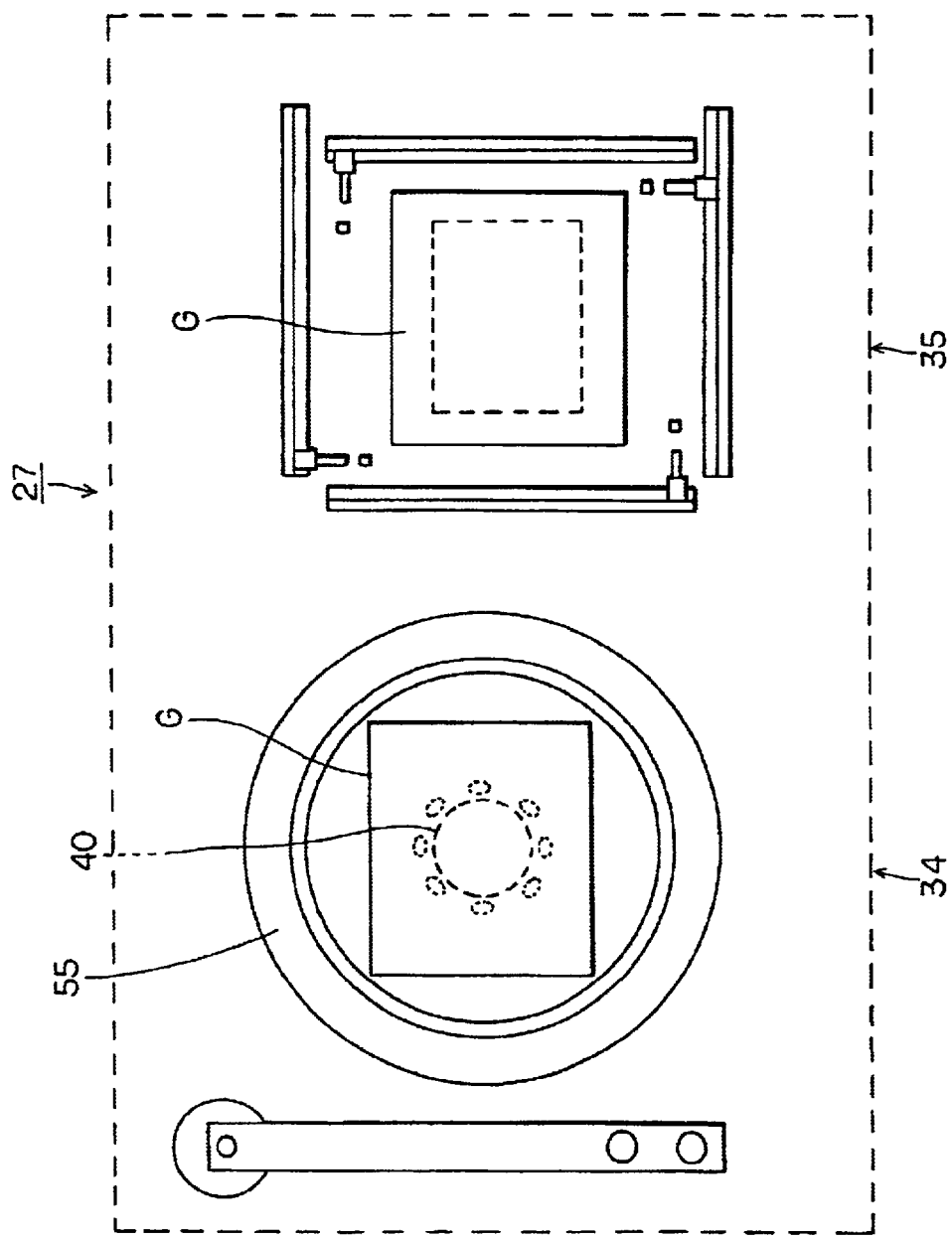
FIG. 3 is a plan view showing the coating/periphery removing unit according to the embodiment of the present invention.

As shown in FIG. 3, the coating/periphery removing unit 27 has a supplying system 34 and a periphery removing system 35 that are adjacently disposed. The supplying system 34 supplies resist solution to the front surface of an LCD substrate G. The periphery removing system 35 removes an unnecessary resist film on the periphery of an LCD substrate G. The coating/periphery removing unit 27 has a conveying mechanism (not shown). The conveying mechanism conveys an LCD substrate G between the supplying system 34 and the periphery removing system 35.

Figure 4A:
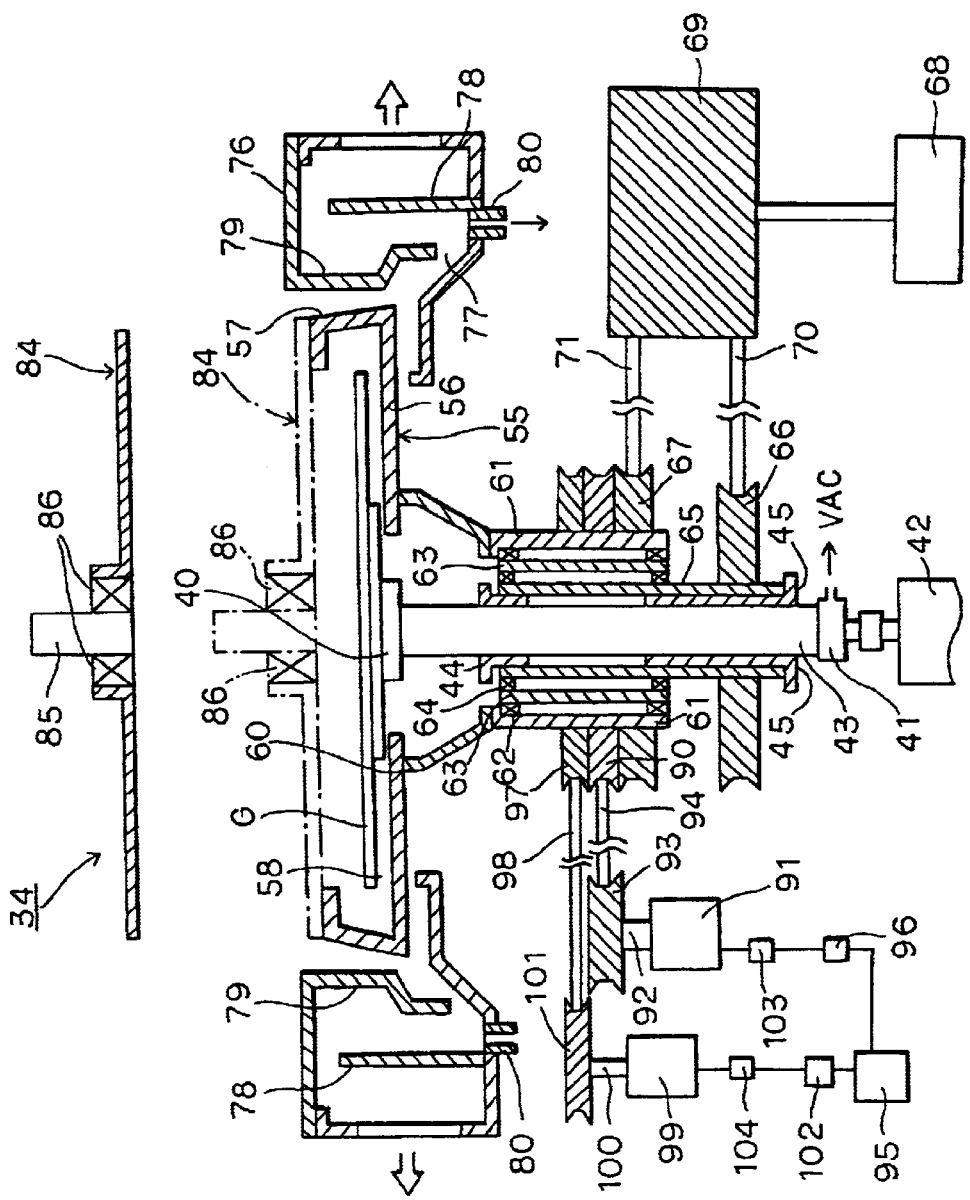
FIG. 4A is a sectional view showing the structure of a supplying system of the coating/periphery removing unit shown in FIG. 3.

As shown in FIG. 4A, the supplying system 34 has a spin chuck 40 that vacuum sucks an LCD substrate G. A rotating shaft 43 is connected to a lower portion of the spin chuck 40. The rotating shaft 43 is connected to a lifting cylinder 42 through a vacuum seal portion 41. Spline bearings 44 and 45 are disposed at an upper position and a lower position of the rotating shaft 43, respectively. A groove (not shown) is formed on the outer peripheral surface of the rotating shaft 43 and the inner peripheral surfaces of the spline bearings 44 and 45 along the elongation direction of the rotating shaft 43. Thus, the spin chuck 40 is lifted up and down corresponding to the movement of the lifting cylinder 42.

A rotation cup 55 is disposed at the outer peripheral portion of the spin chuck 40. The rotation cup 55 surrounds the spin chuck 40. A sealing member such as an O ring is disposed on the bottom surface of the rotation cup 55. In the rotation cup 55, a process chamber 58 is formed with the bottom surface of the rotation cup 55, a side wall of the rotation cup 55, and a lid 84 (that will be described later).

The bottom surface of the rotation cup 55 is connected to the upper end of a connecting pipe 60. The lower end of the connecting pipe 60 is connected to the upper end of a ring-shaped rotating outer pipe 61. The rotating outer pipe 61 is connected to a ring-shaped fixed shaft 63 through a bearing 62. A ring-shaped rotating inner pipe 65 is disposed in the fixed shaft 63 through a bearing 64. The above-mentioned rotating shaft 43 is disposed in the rotating inner pipe 65 through spline bearings 44 and 45. Thus, the rotating shaft 43 is lifted up and down against the rotating inner pipe 65. In addition, the rotating shaft 43 is rotated along with the rotating inner pipe 65.

A follower pulley 67 as a main driving mechanism is disposed in the rotating outer pipe 61. In addition, a follower pulley 66 is disposed in the rotating inner pipe 65. A belt 70 is passed from the follower pulley 66 to a driving pulley 69 driven by a driving motor 68. A belt 71 is passed from the follower pulley 67 to the driving pulley 69 driven by the driving motor 68. Thus, the spin chuck 40 and the rotation cup 55 are synchronously rotated by the same driving motor 68. The lower portion of the spin chuck 40 and the inner lower surface of the rotation cup 55 have respective fitting portions. When the spin chuck 40 is lifted down, it fits the rotation cup 55. Thus, the spin chuck 40 and the rotation cup 55 are synchronously rotated.

The side wall 57 of the rotation cup 55 is upwardly tapered. A flange is formed at the upper end portion of the side wall 57. Air intake openings (not shown) are peripherally formed at predetermined intervals in the flange. An air exhaust opening (not shown) is formed between the lower surface of the rotation cup 55 and the side wall 57. Thus, when the rotation cup 55 is rotated, atmospheric gas flows from the air intake openings (not shown) to the process chamber 58. The atmospheric gas in the process chamber 58 is exhausted from the exhaust opening (not shown) to a ring-shaped drain cup 76.

The drain cup 76 is disposed on the outer periphery of the rotation cup 55. The drain cup 76 has an inner ring-shaped path 77. The ring-shaped path 77 is partitioned by walls 78 and 79. The wall 78 rises from the bottom portion of the drain cup 76. The wall 79 hangs from the ceiling portion of the drain cup 76. Drain holes 80 are peripherally formed at predetermined intervals in the bottom portion formed between the walls 78 and 79. The walls 78 and 79 are disposed so as to cause gaseous mist entered into the drain cup 76 to collide with the walls 78 and 79 and liquify the mist due to inertia collisions.

The above-mentioned lid 84 can be freely placed and removed to/from the upper opening portion of the rotation cup 55. A pipe 85 is disposed at the center portion of the lid 84 through a bearing 86. Resist solution is coated to an LCD substrate G through the pipe 85. Solvent of resist solution is sprayed to the inner periphery of the rotation cup 55. The lid 84 is connected to a lifting mechanism (not shown). The lid 84 is lifted up and down by the lifting mechanism (not shown).

In the supplying system 34, for example a follower pulley 90 as a first auxiliary driving mechanism is disposed to the rotating outer pipe 61. A belt 94 is passed from the follower pulley 90 to a driving pulley 93 disposed to a driving shaft 92 of an air motor 91. The air motor 91 functions as an auxiliary driving means that assists the driving of the driving motor 68. Since the air motor 91 assists the driving of the driving motor 68, the rotation cup 55 that accommodates an LCD substrate G can be rotated at a predetermined rotating acceleration. As a second auxiliary driving mechanism, a follower pulley 97 is disposed to the rotating outer pipe 61. A belt 98 is passed from the follower pulley 97 to a driving pulley 101 disposed to a driving shaft 100 of an air motor 99.

The air motor 99 functions as a second auxiliary driving means that assists the driving of the driving motor 68. Since the air motor 99 assists the driving of the driving motor 68, the rotation cup 55 that accommodates an LCD substrate G can be rotated at a predetermined rotating acceleration. The gear ratio of the first auxiliary driving mechanism is different from the gear ratio of the second auxiliary driving mechanism. The gear ratio between the driving pulley 93 and the follower pulley 90 of the first auxiliary driving mechanism is larger than the gear ratio between the driving pulley 101 and the follower pulley 97 of the second auxiliary driving mechanism. The gear ratio of the second auxiliary driving mechanism is larger than the gear ratio between the driving pulley 69 and the follower pulley 67 of the main driving mechanism. The gear ratio of each auxiliary driving mechanism is larger than the gear ratio of the main driving mechanism. Thus, the rotating acceleration of the second auxiliary driving mechanism is larger than the rotating acceleration of the main driving mechanism. The rotating acceleration of the first auxiliary driving mechanism is larger than the rotating acceleration of the second auxiliary driving mechanism.

The air motors 91 and 99 are driven by compressed air supplied from an air supply source 95. The pressure of the compressed air is controlled by adjusting units 96 and 102. An air operating valve 103 is disposed between the air motor 91 and the adjusting unit 96. An air operating valve 104 is disposed between the air motor 99 and the adjusting unit 102. As shown in FIG. 4B, a control section 105 that causes the air operating valves 103 and 104 to be opened and closed is disposed. The control section 105 also causes the air motors 91 and 99 to be started and stopped. When the air motors 91 and 99 are not driven, their rotation resistance is very low. Thus, even if the air motors 91 and 99 are not driven, they do not disturb the rotating acceleration of the driving motor 68. The control section 105 causes the driving motor 68 to be started and stopped. Since the main driving mechanism and the auxiliary driving mechanisms are connected to the rotation cup 55, the revolution speed of the main driving mechanism is almost the same as the revolution speed of each of the auxiliary driving mechanisms. The control section 105 designates the revolution speed of the rotation cup 55 corresponding to the revolution speed of the main driving mechanism and/or the revolution speed of each of the auxiliary driving mechanisms.

The coating/periphery removing unit 27 is structured as described above. Next, the operation and effect of the coating/periphery removing unit 27 will be described.

When a cassette 11 that accommodates raw LCD substrates G is placed on the cassette table 10, the sub-conveying unit 13 accesses the cassette 11 and unloads one LCD substrate G therefrom. The sub-conveying unit 13 conveys the LCD substrate G to the transferring table 14 disposed in the loader portion 2 and places the LCD substrate G on the transferring table 14.

The main conveying unit 15 holds the LCD substrate G with the conveying arm 15*a* and conveys the LCD substrate G to the ultraviolet ray ozone cleaning unit 19. The ultraviolet ray ozone cleaning unit 19 cleans the LCD substrate G of organic contaminations. The main conveying unit 15 conveys the resultant LCD substrate G to the scrubber cleaning unit 17. The scrubber cleaning unit 17 performs a scrubber cleaning process for the LCD substrate G. The main conveying unit 15 holds the LCD substrate G with the conveying arm 15*a* and conveys the LCD substrate G to the transferring table 23.

The main conveying unit 25 holds the LCD substrate G on the transferring table 23 with the conveying arm 25*a* and conveys the LCD substrate G to the hydrophobic process unit 28. After the hydrophobic process unit 28 has performed the hydrophobic process for the LCD substrate G, the main conveying unit 25 holds the LCD substrate G with the conveying arm 25*a* and conveys the LCD substrate G to the coating/periphery removing unit 27.

Figure 5:
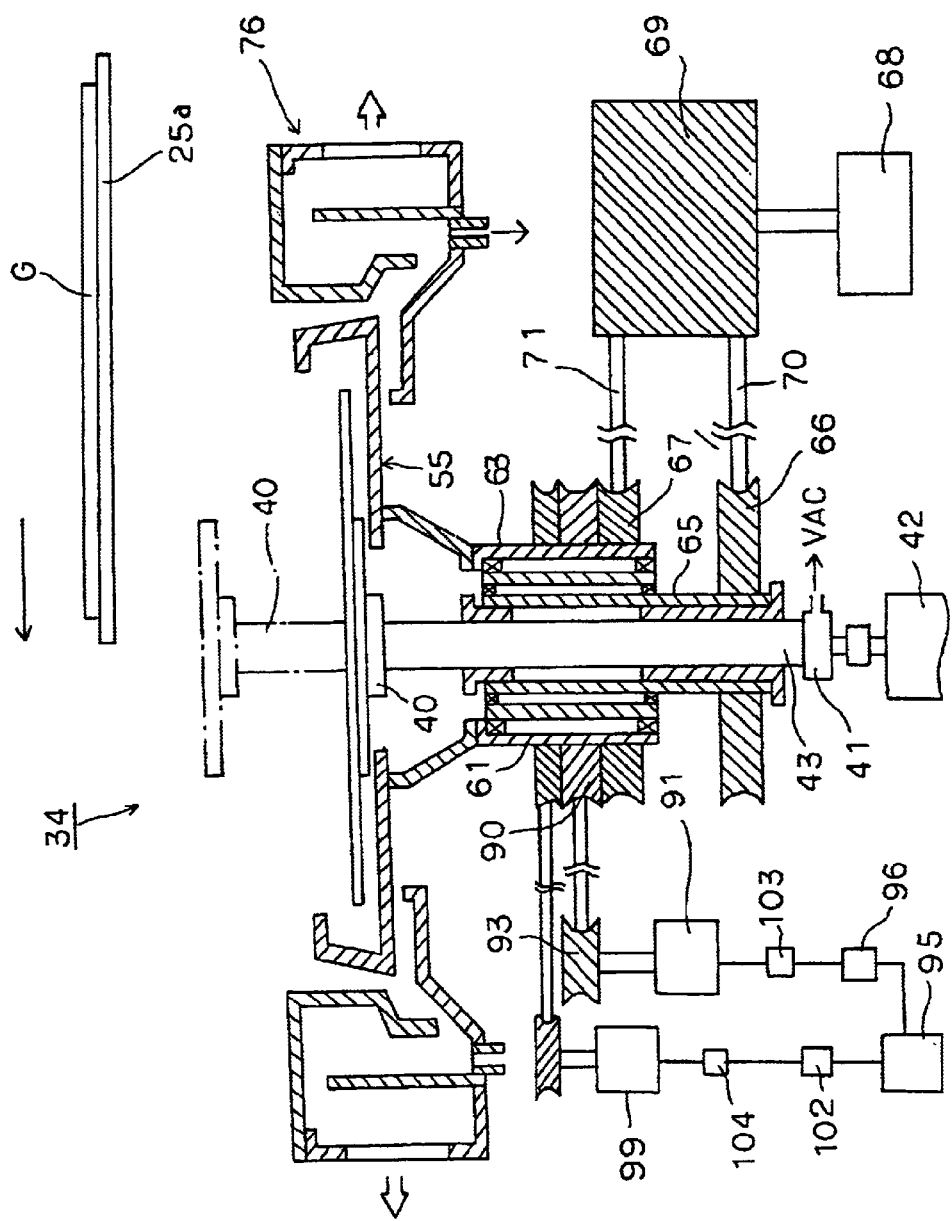
FIG. 5 is a schematic diagram for explaining the state that an LCD substrate is loaded to the supplying system shown in FIG. 4A.

The main conveying unit 25 conveys the LCD substrate G to the supplying system 34 of the coating/periphery removing unit 27. At this point, the spin chuck 40 is placed in a ready position denoted by dotted line shown in FIG. 5. The main conveying unit 25 holds the LCD substrate G with the conveying arm 25*a* and conveys the LCD substrate G to the spin chuck 40 placed in the ready position. The spin chuck 40 vacuum sucks the LCD substrate G. The lifting cylinder 42 lifts down the spin chuck 40 from the ready position denoted by the dotted line shown in FIG. 5 to a process position denoted by solid line shown in FIG. 5. After the spin chuck 40 has lifted down to the process position, the spin chuck 40 fits the rotation cup 55 through their fitting portions.

Figure 6:
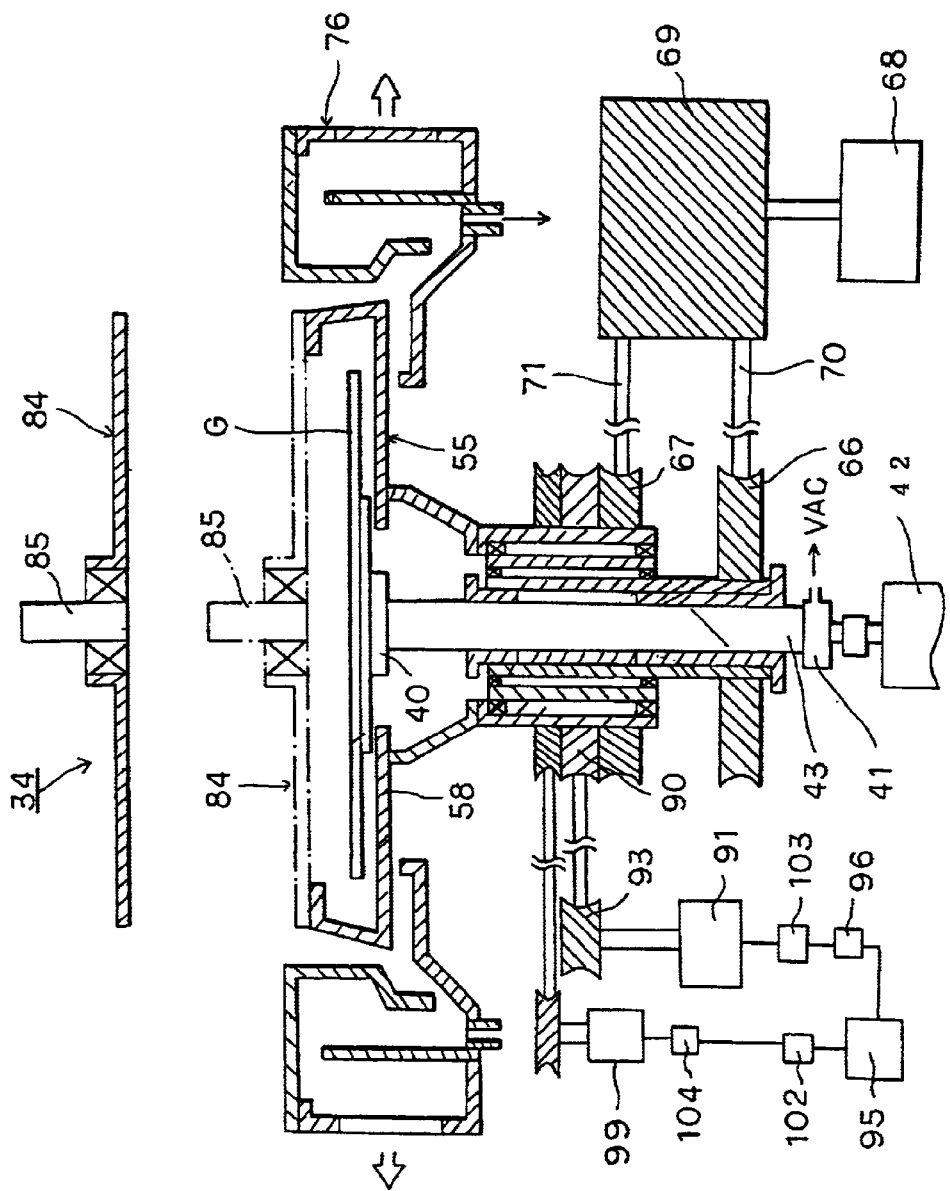
FIG. 6 is a schematic diagram for explaining the state that a rotation cup that accommodates an LCD substrate is closed with a lit.

After the conveying arm 25 has transferred the LCD substrate G to the spin chuck 40 and retreated from the supplying system 34, the lifting mechanism (not shown) lifts down the lid 84 from an open position denoted by a solid line shown in FIG. 6 to a close position denoted by a dotted line shown in FIG. 6. Thus, the lid 84 closes the upper opening portion of the rotation cup 55. The control section 105 causes the driving motor 68 to rotate the spin chuck 40 and the rotation cup 55. Thus, the LCD substrate G placed in the rotation cup 55 rotates. Thereafter, the control section 105 causes the air operating valve 103 to open and the air motor 91 to assist the driving of the driving motor 68. At this point, the air operating valve 104 is closed. Thus, air does not flow to the air motor 99. The gear ratio of the air motor 91 is larger than the gear ratio of the driving motor 68. Thus, the rotating acceleration of the LCD substrate G becomes larger than the case that only the driving motor 68 is driven.

Next, solvent and resist solution are successively dropped from the pipe 85 to the center of the LCD substrate G. Thereafter, the control section 105 causes the air operating valve 104 to open and the air motor 99 to drive. At this point, the operation time of the air motor 91 overlaps with the operation time of the air motor 99. After a predetermined time period has elapsed, the rotating acceleration of the air motor 99 becomes stable. The control section 105 causes the air operating valve 103 to close and thereby stop supplying air to the air motor 91. The control section 105 causes the air motor 99 to assist the driving of the driving motor 68 so as to accelerate the rotation of the driving motor 68. When the driving motor 68 starts rotating, since a large shaft rotating force is required due to moment of inertia, the air motor 91 is driven. After the rotation of the driving motor 68 is accelerated, the air motor 99 assists the driving of the driving motor 68. Thus, while the driving motor 68 is being driven, the auxiliary driving mechanisms are driven in the order of larger gear ratios. Consequently, a larger rotating acceleration can be obtained than the case that only the driving motor 68 is driven. In addition, after the predetermined time period elapses before a predetermined revolution speed (for example, 1500 rpm) is obtained, the air operating valve 104 is closed and thereby air supply to the air motor 99 is sopped. Thereafter, the LCD substrate G is rotated at a predetermined rotating acceleration until the maximum revolution speed (for example, 1500 rpm) is obtained. Thus, the resist solution concentrically spreads out to the periphery of the LCD substrate G.

When the LCD substrate G is rotated at the maximum revolution for a several seconds, a resist film with an equal thickness can be formed on the LCD substrate G.

After the resist film is formed on the LCD substrate G, the spin chuck 40 and the rotation cup 55 are decelerated and stopped. In the deceleration range, the air motors 91 and 99 do not assists the driving of the driving motor 68. The lifting mechanism (not shown) lifts up the lid 84 and opens the upper opening portion of the rotation cup 55. The lifting cylinder 42 lifts up the spin chuck 40. The conveying arm 25a unloads the LCD substrate G from the rotation cup 55. Next, the conveying mechanism (not shown) conveys the LCD substrate G from the supplying system 34 to the periphery removing system 35.

The main conveying unit 25 unloads the LCD substrate G from the coating/periphery removing unit 27 with the conveying arm 25a. The main conveying unit 25 holds the LCD substrate G with the conveying arm 25a and conveys the LCD substrate G to the heating unit 30. The heating unit 30 performs a predetermined heating process for the LCD substrate G.

In the coating/periphery removing unit 27, the air motors 91 and 99 assist the driving of the driving motor 68. In at least part of the acceleration region, the LCD substrate G is accelerated by a plurality of driving mechanisms. Thus, even if an LCD substrate G becomes large, it can be rotated at a predetermined rotating acceleration along with the rotation cup 55. Consequently, the resist solution equally and concentrically spreads out to the periphery of the LCD substrate G. As a result, a resist film with an equal thickness is formed on the LCD substrate G with a smaller quantity of resist solution than the conventional apparatus.

Figure 7:
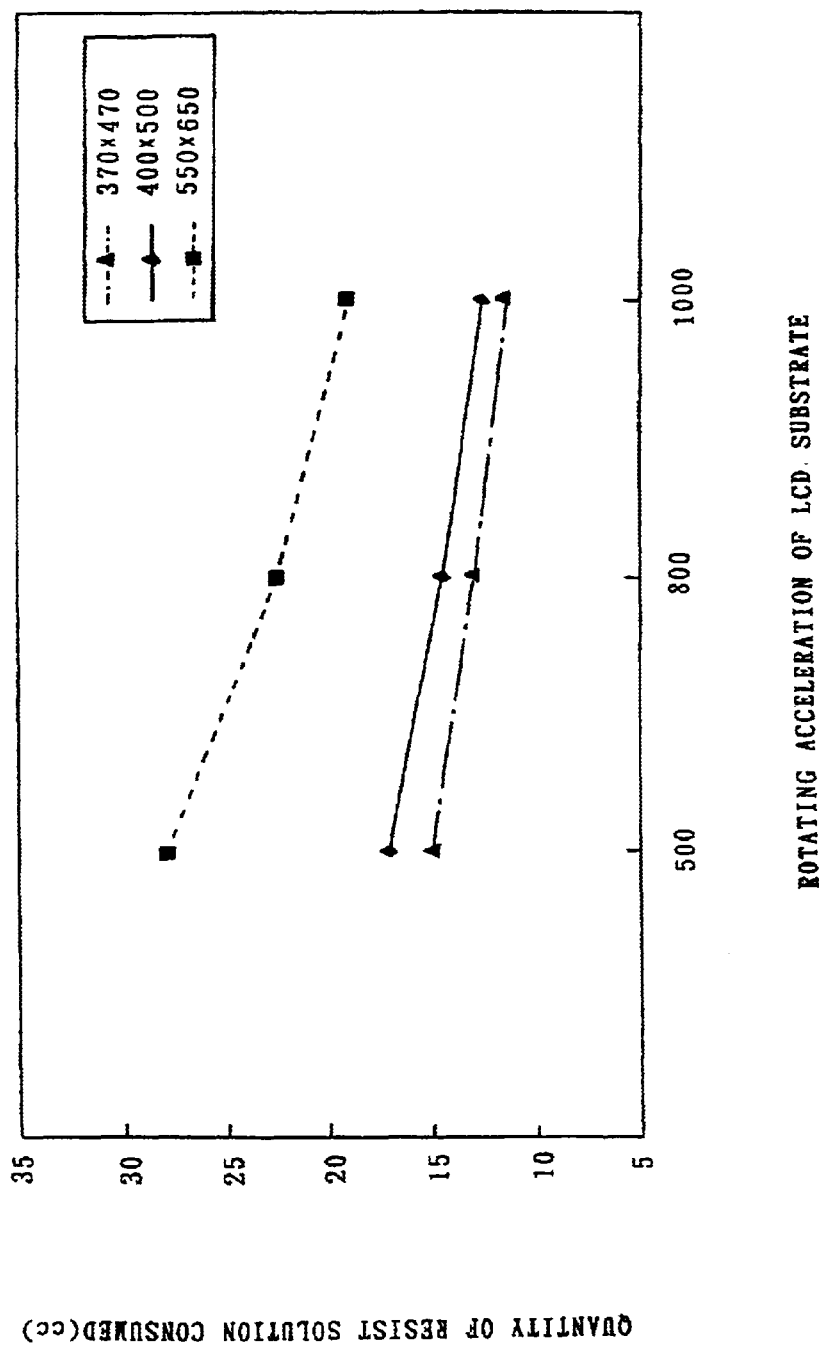
FIG. 7 is a graph showing the relation between rotating accelerations of three LCD substrates in different sizes and the quantity of resist solution consumed therewith.

FIG. 7 shows the relation between rotating accelerations of three LCD substrates G in different sizes and the quantity of resist solution consumed therewith. In FIG. 7, the quantity of resist solution consumed with three LCD substrates G in three sizes of 370×470 mm, 400×500 mm, and 550×650 mm is plotted in the case that they are rotated at three rotating accelerations of 500 rpm/sec, 800 rpm/sec, and 1000 rpm/sec. In FIG. 7, the vertical axis and the horizontal axis represent the quantity of resist solution consumed with the LCD substrates G and the rotating accelerations thereof, respectively.

In FIG. 7, three lines that decline are obtained. Thus, it is clear that as an LCD substrate G is rotated at a larger rotating acceleration, the quantity of resist solution consumed therewith decreases.

Corresponding to the graph data shown in FIG. 7, the ratio of the quantity of resist solution consumed with each LCD substrate G rotated at a rotating acceleration of 500 (rpm/sec), the quantity of resist solution consumed with each LCD substrate G rotated at a rotating acceleration of 800 (rpm/sec), and the quantity of resist solution consumed with each LCD substrate G rotated at a rotating accelerating of 1000 (rpm/sec) is calculated and plotted as consumption rate of resist solution on the vertical axis. The rotating accelerations of the LCD substrates are plotted on the horizontal axis. The plotted data is shown in FIG. 8. FIG. 8 shows that as an LCD substrate G is rotated at a larger rotating acceleration, the consumption rate of the resist solution largely decreases. The effect becomes remarkable as the size of the LCD substrate G becomes large.

Figure 9:
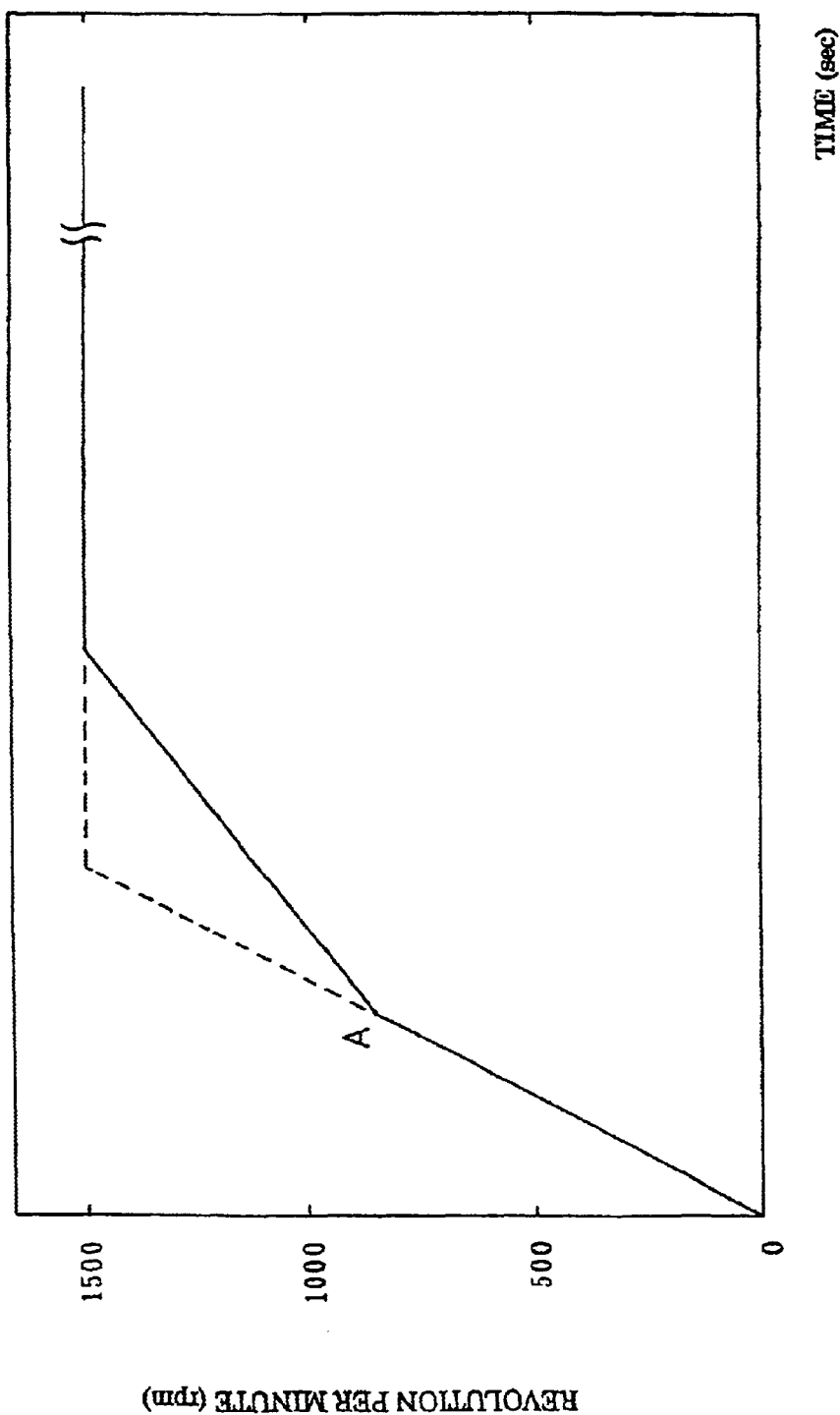
FIG. 9 is a graph showing a chronological change of revolutions of an LCD substrate.

To form a resist film with an equal film thickness, as denoted by a dotted line shown in FIG. 9, until the revolution speed of an LCD substrate G becomes the maximum revolution speed (1500 rpm), it is not necessary to cause the air motors 91 and 99 to assist the driving of the driving motor 69. Instead, before the revolution speed of the LCD substrate G becomes the predetermined revolution speed, the air motors 91 and 99 can be stopped. For example, as denoted by a solid line shown in FIG. 9, until the revolution speed of the LCD substrate G becomes A that is in the middle of the maximum revolution speed, the air motors 91 and 99 successively assist the driving of the driving motor 68. Thereafter, the LCD substrate G is driven by only the driving motor 68.

According to the embodiment, the rotating shaft 43 is rotated by the driving motor 68 and the air motors 91 and 99 through the spline shaft 45. However, according to the present invention, the portions that transfer the driving force of the driving motor 68 and the air motors 91 and 99 are not limited to those of the embodiment.

Figure 10:
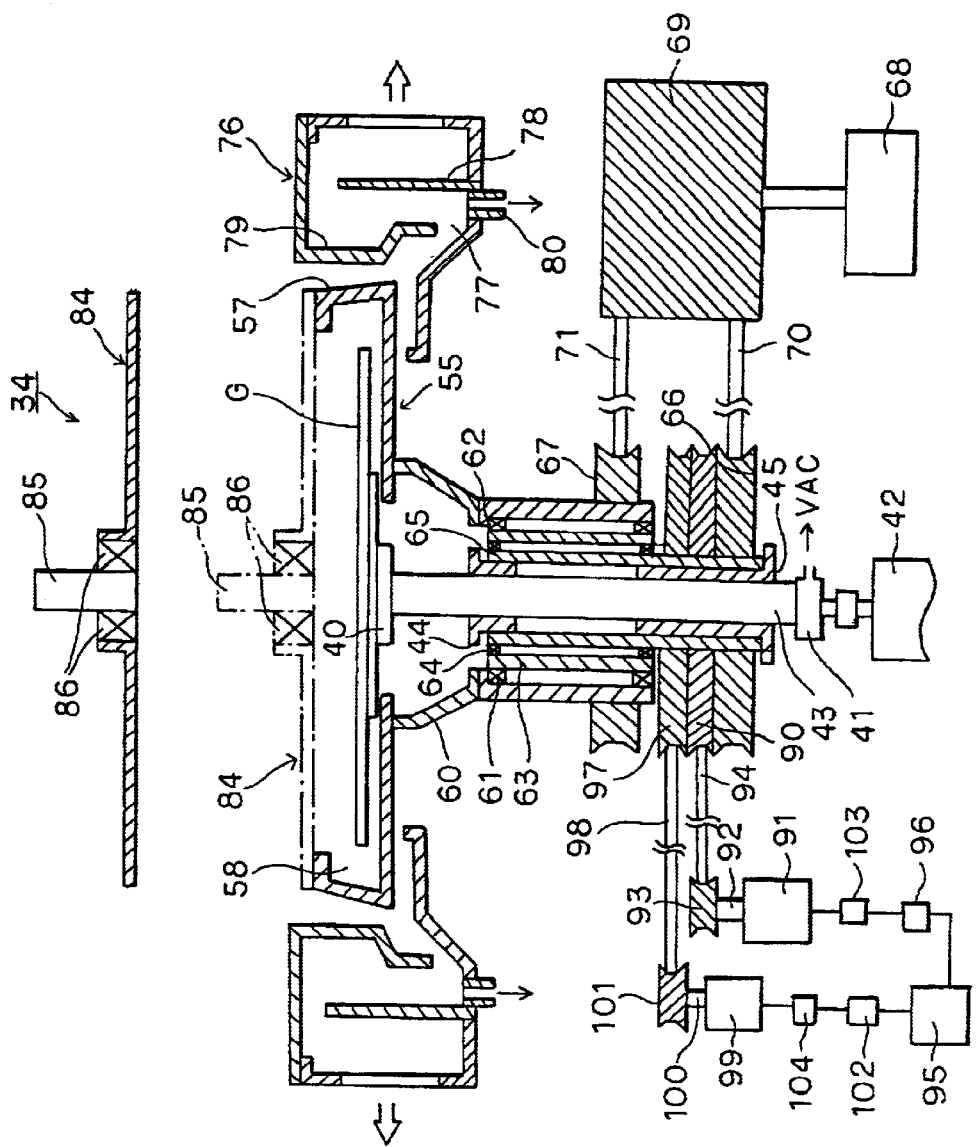
FIG. 10 is a sectional view showing a first modification of the supplying system shown in FIG. 4A.

For example, as shown in FIG. 10, the follower pulley 67 is disposed to the rotating outer pipe 61 of the rotation cup 55. The follower pulleys 90 and 97 are disposed to the rotating inner pipe 65. When resist solution dropped to the LCD substrate G is spread out on the LCD substrate G, the driving motor 68 that rotates the rotating shaft 43 may be assisted by the air motors 91 and 99.

In other words, since the spin chuck 40 and the rotation cup 55 are connected and synchronously rotated, the LCD substrate G and the rotation cup 55 can be rotated at a predetermined rotating acceleration. Thus, as with the embodiment, since resist solution dropped on the LCD substrate G is equally spread out to the periphery thereof, a resist film with a predetermined film thickness can be formed.

Since the LCD substrate G and the rotation cup 55 are rotated together, the rotation of the LCD substrate G does not disturb the atmosphere in the process chamber 58. Thus, since the film thickness of the resist film does not vary, the equality of the film thickness of the resist film improves.

Figure 11:
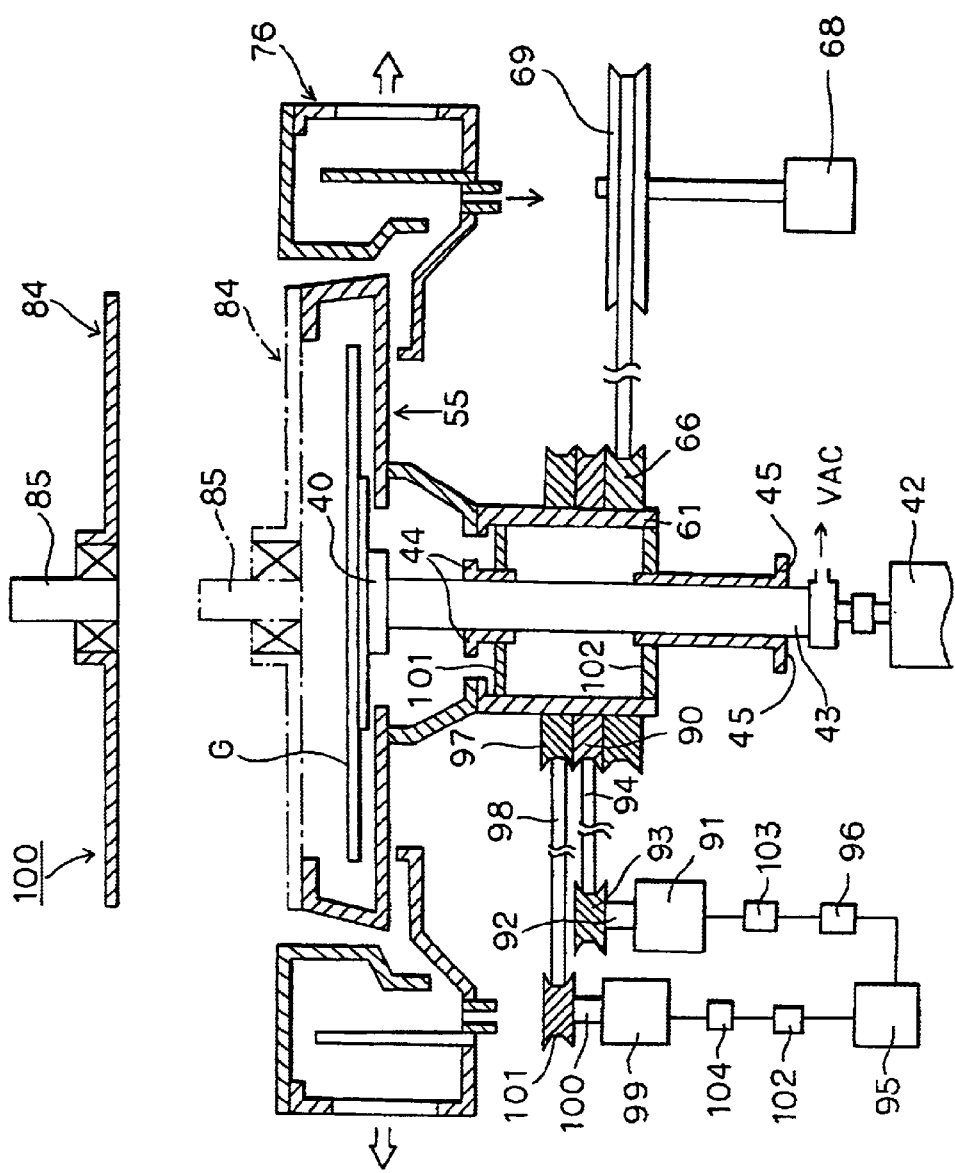
FIG. 11 is a sectional view showing a second modification of the supplying system shown in FIG. 4A.

According to the present invention, a supplying system 100 shown in FIG. 11 can be used instead of the supplying system 34 of the embodiment. The supplying system 100 has intermediate rings 101 and 102. The intermediate ring 101 is disposed between a spline bearing 44 and a rotating outer pipe 61. The intermediate ring 102 is disposed between a spline bearing 45 and the rotating outer pipe 61. A spin chuck 40 freely lifts up and down against a rotation cup 55. The spin chuck 40 and the rotation cup 55 rotate together. Follower pulleys 66, 90, and 97 are disposed to the rotating outer pipe 61. The follower pulley 66 is rotated by the rotating drive force of a driving motor 68. The follower pulley 90 is rotated by rotating drive force of an air motor 91. The follower pulley 97 is rotated by rotating drive force of the air motor 99.

In the supplying system 100, the spin chuck 40 and the rotation cup 55 are synchronously rotated. Thus, the spin chuck 40 and the rotation cup 55 can be rotated at a large rotating acceleration by the driving motor 68 and the air motors 91 and 99.

In the embodiment, two auxiliary driving mechanisms are disposed. However, it should be noted that the number of auxiliary driving mechanisms is not limited to two. In other words, at least one auxiliary driving mechanism can be used. When one auxiliary driving mechanism is disposed, the number of structural parts of the apparatus can be reduced. Thus, the apparatus becomes small. In addition, since the control mechanism of the apparatus is simplified, the reliability of the apparatus improves. In contrast, when three or more auxiliary driving mechanisms are disposed, since three or more gear ratios are used, the rotation of an LCD substrate G can be smoothly accelerated. Thus, a film of process solution with an equal thickness can be formed on the substrate. In addition, since the gear ratios are finely designated, the auxiliary driving mechanisms can accelerate the rotation of the substrate to some extent. Consequently, the size of the main driving mechanism can be further reduced.

In the embodiment, before the air motor 91 is operated, the driving motor 68 is operated. Alternatively, the air motor 91 and the driving motor 68 can be operated at the same time. In this case, the rotation of the LCD substrate G can be accelerated in a shorter time period. Thus, the throughput of the apparatus improves.

In the embodiment, the operation time of the air motor 91 at least partly overlaps with and the operation time of the air motor 99. However, it should be noted that the operation time of the air motor 91 may not overlap with the operation time of the air motor 99. In this case, the quantity of air consumed by the air motors 91 and 99 can be reduced. After the air motor 91 is stopped, until the rotating acceleration of the air motor 99 becomes stable, the rotating acceleration of the LCD substrate G is low. However, since the driving motor 68 is operated, the rotation of the LCD substrate G is not decelerated. Thus, the revolution speed of the driving motor 68 can be maintained at the point. Thus, after the rotating acceleration of the air motor 99 becomes stable, the rotation of the LCD substrate G can be further accelerated.

It should be noted that the control section 105 causes the adjusting units 96 and 102 to adjust the pressure of compressed air supplied to the air motors 91 and 99. In this case, the control section 105 can adjust the rotating acceleration of the LCD substrate G.

The effects of the air motors 91 and 99 can be accomplished by conventional electric motors.

The timings of the operations of the air motors 91 and 99 may be varied from those of the embodiment.

Instead of the pipe 85 disposed at the center of the lid 84, an arm with the pipe 85 may be disposed outside the rotation cup 55. Resist solution and solvent are supplied from the pipe 85 disposed on the arm. In this case, when the resist solution and solvent are supplied from the pipe 85, the lid 84 is lifted up.

Figure 12:
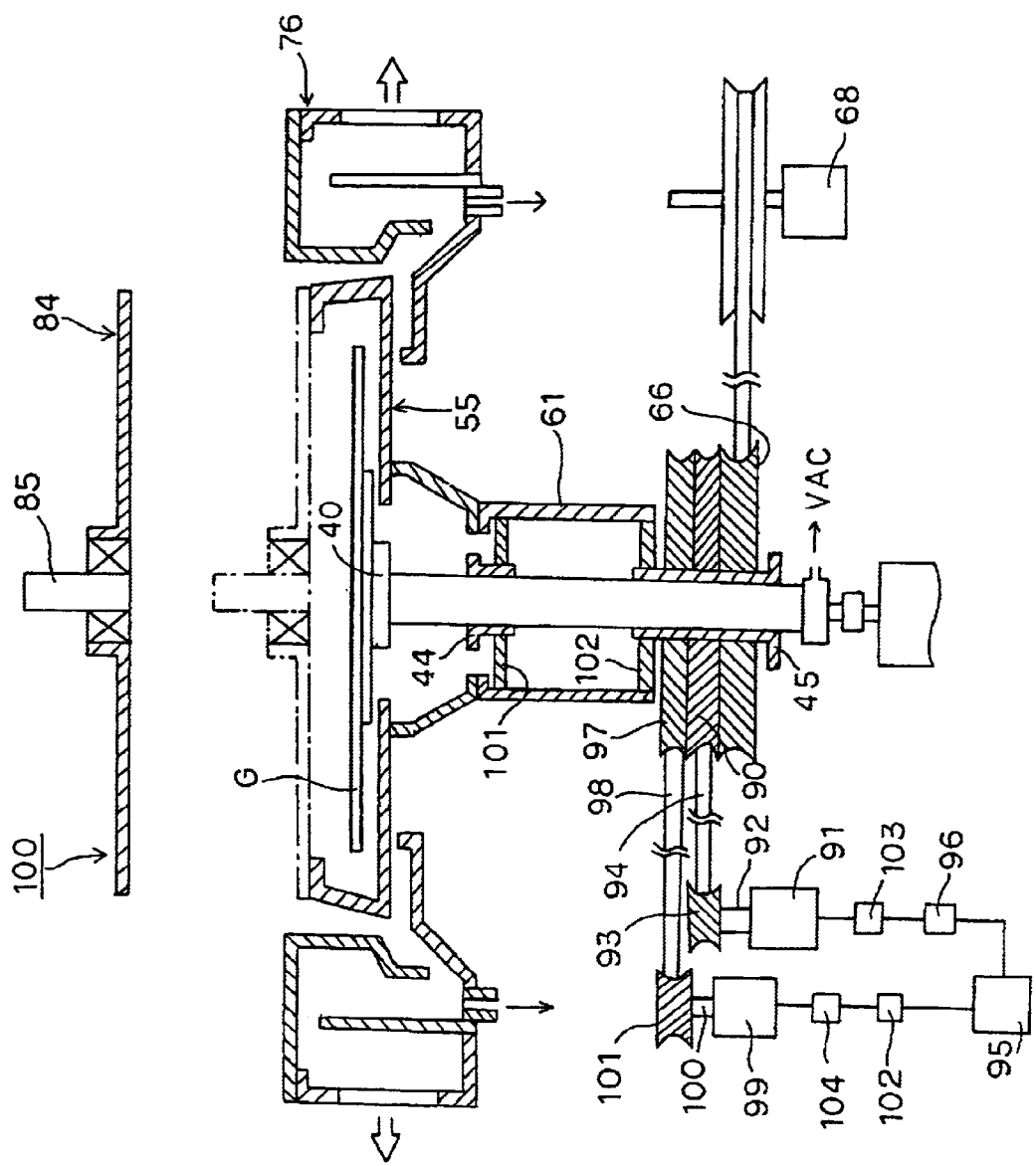
FIG. 12 is a sectional view showing a third modification of the supplying system shown in FIG. 4A.

As shown in FIG. 12, the follower pulleys 66 and 90 may be disposed to the rotating shaft 43 through the spline bearing 45. In the embodiment, LCD substrates are used. However, according to the present invention, instead of LCD substrates, for example, CD substrates and semiconductor wafers may be used.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A film forming method, comprising the steps of:
supplying process solution to a substrate;
rotating the substrate at a predetermined revolution speed;
spreading out the process solution on the substrate; and
forming a film of the process solution on the substrate, wherein the rotation of the substrate is accelerated in at least part of an acceleration region of the predetermined revolution speed by a main driving mechanism and a plurality of auxiliary driving mechanisms for assisting the driving of the main driving mechanism.

2. The film forming method as set forth in claim 1, wherein the plurality of auxiliary driving mechanisms are stopped before the substrate is rotated at the predetermined revolution speed.

3. The film forming method as set forth in claim 1, wherein a cup disposed around the substrate is rotated corresponding to the predetermined revolution speed.

4. The film forming method as set forth in claim 1, wherein after the rotation of the substrate is accelerated, the plurality of auxiliary driving mechanisms do not assist the driving of the main driving mechanism in a deceleration region.

5. The film forming method as set forth in claim 1, wherein at least one of the auxiliary driving mechanisms is operating.

* * * * *